(12) United States Patent
Saiki et al.

(10) Patent No.: US 8,319,111 B2
(45) Date of Patent: Nov. 27, 2012

(54) WIRING BOARD HAVING WIRING LAMINATE PORTION WITH VIA CONDUCTORS EMBEDDED IN RESIN INSULATING LAYERS

(75) Inventors: Hajime Saiki, Aichi (JP); Mikiya Sakurai, Gufu (JP); Atsuhiko Sugimoto, Gifu (JP)

(73) Assignee: NGK Spark Plug Co., Ltd., Aichi-ken (JP)

( * ) Notice: Subject to any disclaimer, the term of this patent is extended or adjusted under 35 U.S.C. 154(b) by 1244 days.

(21) Appl. No.: 11/865,919

(22) Filed: Oct. 2, 2007

(65) Prior Publication Data

US 2008/0083560 A1    Apr. 10, 2008

(30) Foreign Application Priority Data

Oct. 4, 2006  (JP) ................. 2006-272820

(51) Int. Cl.
*H05K 1/03* (2006.01)
(52) U.S. Cl. ...................... 174/255; 174/264
(58) Field of Classification Search .............. 174/250, 174/255, 260, 264; 361/763, 764; 29/830
See application file for complete search history.

(56) References Cited

U.S. PATENT DOCUMENTS

| 6,350,365 | B1 * | 2/2002 | Koyama et al. ............... 205/125 |
| 6,370,768 | B1 | 4/2002 | Itabashi ........................... 29/852 |
| 7,078,628 | B2 * | 7/2006 | Watanabe et al. ............. 174/256 |
| 7,183,497 | B2 | 2/2007 | Kojima et al. ................. 174/262 |
| 7,696,442 | B2 * | 4/2010 | Muramatsu et al. .......... 174/260 |
| 2003/0178229 | A1 | 9/2003 | Toyoda et al. ................ 174/261 |
| 2005/0103520 | A1 | 5/2005 | Saiki et al. ..................... 174/250 |
| 2008/0190658 | A1 | 8/2008 | Toyoda et al. ................ 174/263 |

FOREIGN PATENT DOCUMENTS

| CN | 1620232 A | 5/2005 |
| JP | 11-103171 | 4/1999 |
| JP | 2002 359469 | 12/2002 |
| JP | 2003 23253 | 1/2003 |
| JP | 2003304062 | 10/2003 |
| JP | 2005 159268 | 6/2005 |
| JP | 2005203764 | 7/2005 |

OTHER PUBLICATIONS

Office Action received from the Chinese Patent and Trademark Office for corresponding Chinese Patent Application No. 20710149974.6, dated Aug. 7, 2009 (including English translation).
Office Action received from the Japanese Patent Office for related Japanese Patent Application No. 2007-260364 dated Oct. 27, 2010 (including English translation).

\* cited by examiner

*Primary Examiner* — Yuriy Semenenko
(74) *Attorney, Agent, or Firm* — Kusner & Jaffe

(57) ABSTRACT

A wiring board having a favorable electrical reliability and in which a crack is unlikely to occur at a connection interface of via conductors even though the number of via conductors in series, which constitutes the stacked via, becomes larger than that of a conventional wiring board.

24 Claims, 12 Drawing Sheets

Fig. 6

|  | Tests | | Results of Observation |
|---|---|---|---|
| Embodiment | T/S-B | 1000cycle | No crack |
| | T/C-B | 500cycle | No crack |
| | | 1000cycle | No crack |
| | T/C-A | 3000cycle | No crack |
| | HAST | 96h | No crack |
| Comparative Example | T/S-B | 1000cycle | Tiny crack |
| | T/C-B | 500cycle | No crack |
| | | 1000cycle | No crack |
| | T/C-A | 3000cycle | Tiny crack |
| | HAST | 96h | No crack |

Fig. 8

|  |  | TypeA | TypeB | TypeC | TypeD | TypeE |
|---|---|---|---|---|---|---|
| Embodiment | T/S-B 100cycle | No crack | No crack | No crack | No crack | No crack |
|  | 500cycle | No crack | No crack | No crack | No crack | No crack |
|  | 1000cycle | No crack | No crack | No crack | No crack | No crack |
| Comparative Example | T/S-B 100cycle | No crack | No crack | No crack | No crack | No crack |
|  | 500cycle | Tiny crack | Tiny crack | Tiny crack | Tiny crack | Tiny crack |
|  | 1000cycle | Tiny crack | Tiny crack | Tiny crack | Tiny crack | Tiny crack |

| Structure | Number of layers | R-Shift | | Crack | | viapop |
|---|---|---|---|---|---|---|
| | | T/S 100 | T/S 500 | T/S 100 | T/S 500 | T/S 100 |
| Area corresponding to the center of thourhg-hole | 3 | 0/9pcs OK | 0/9pcs OK | 0/75via OK | 0/60via OK | 0/140via OK |
| | 4 | 0/10pcs OK | 0/10pcs OK | 0/80via OK | 5/80via NG | 0/200via OK |
| | 5 | — | — | 0/75via OK | 7/125via NG | 0/260via OK |
| | 6 | 0/10pcs OK | 4/10pcs NG | 0/88via OK | 10/90via NG | 1/260via OK |
| Area corresponding to the edge of through-hole | 3 | — | — | 3/126via NG | 5/111via NG | 6/280via NG |
| | 4 | — | — | 3/160via NG | 1/160via NG | 12/280via NG |
| | 5 | — | — | 3/150via NG | 18/250via NG | 47/280via NG |
| | 6 | — | — | 14/170via NG | 31/180via NG | 68/280via NG |
| Shift Via Conductor formed in First Layer | 3 | — | — | 0/160via OK | — | — |
| | 4 | — | — | 0/160via OK | — | — |
| | 5 | — | — | 20/160via NG | — | — |
| | 6 | — | — | 18/160via NG | — | — |

| | 3 Layers | 4 Layers | 5 Layers | 6 Layers |
|---|---|---|---|---|
| | △ No problem unless stacked via disposed on an area corresponding to edge of through-hole | ✕ | ✕ | ✕ Also, NG regarding the rate of resistance change |
| | ○ | ✕ | ✕ | ✕ Also, NG regarding the rate of resistance change |

○ : No problem on reliability
△ : No problem on reliability if design is limited
✕ : Not applicable Fig. 11
Design I
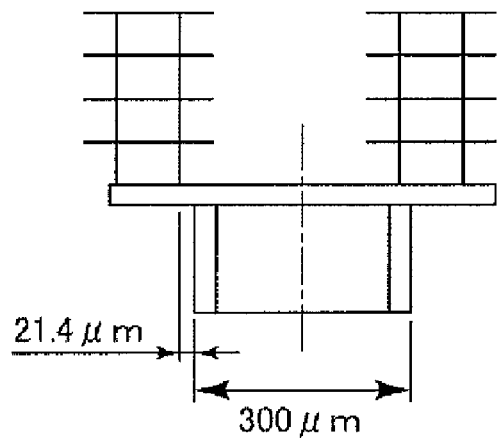
21.4 μm
300 μm
Design II
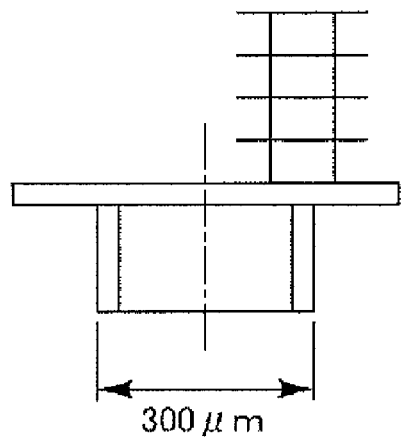
300 μm
Design III
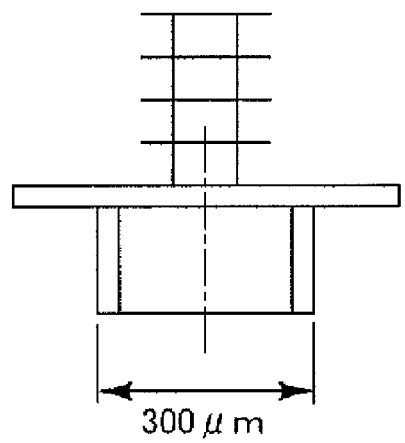
300 μm

Fig. 12

| Test Items | Conditions | Via Diameter (φ75μm Top) | | | Via Diameter (φ65μm Top) | | |
|---|---|---|---|---|---|---|---|
| | | Design I | Design II | Design III | Design I | Design II | Design III |
| T/S-B (−55~125deg C) | 100cycle | 0/40vias | 0/12vias | 0/40vias | 0/40vias | 0/12vias | 0/40vias |
| | 500cycle | 0/40vias | 0/12vias | 0/40vias | 0/40vias | 0/8vias | 0/28vias |
| | 1000cycle | 0/40vias | 0/12vias | 0/24vias | 1/40vias | 0/8vias | 0/40vias |
| | 1500cycle | 0/80vias | 0/12vias | 0/80vias | 0/80vias | 0/12vias | 0/80vias |
| T/C (0~100deg C) | 1000cycle | 0/80vias | 0/12vias | 0/80vias | 0/80vias | 0/12vias | 0/80vias |
| | 2000cycle | 0/80vias | 0/11vias | 0/80vias | 0/80vias | 0/12vias | 0/80vias |
| | 3000cycle | 0/80vias | 0/12vias | 0/80vias | 0/80vias | 0/12vias | 0/80vias |
| T/C-B (−55~125deg C) | 500cycle | 0/55vias | 0/4vias | 0/40vias | 0/80vias | 1/12vias | 0/80vias |
| | 1000cycle | 0/80vias | 0/8vias | 0/40vias | 0/80vias | 0/12vias | 0/80vias |
| | 1500cycle | 0/80vias | 0/12vias | | | | |
| HAST (135deg C 85%) | 96hrs | | 0/12vias | | | | |
| | 192hrs | | | | | | |

WIRING BOARD HAVING WIRING LAMINATE PORTION WITH VIA CONDUCTORS EMBEDDED IN RESIN INSULATING LAYERS

FIELD OF THE INVENTION

The present invention relates generally to a wiring board, and more particularly to a wiring board having a core board and a wiring laminate portion.

BACKGROUND OF THE INVENTION

Conventionally, an organic package substrate is used for a wiring board in which a semiconductor integrated circuit element (hereinafter referred to as an "IC chip") is mounted. The wiring board is comprised of: a core board in which a through-hole conductor is formed along an inner wall of a through-hole that penetrates a plate-like core material in the thickness direction of the core board and a filler is charged into the through-holes; and a wiring laminate portion formed in such a manner that a plurality of conductor layers and a plurality of layer-shaped interlayer insulating materials are alternately laminated on a major plane of the core board, and a plurality of via conductors used for an electrical connection between the conductor layers is embedded in the interlayer insulating materials. For example, see Japanese Patent Application Laid-Open (kokai) No. H11-103171 and Japanese Patent Application Laid-Open (kokai) No. 2005-203764.

In recent years, further advanced features of wiring boards have been in demand, and thus wiring boards with high density wiring and large number of layers have been indispensable. As for via conductors, for example, a stacked via, where a series of filled via is formed in a through-hole of an interlayer insulating material, is formed in the thickness direction of the core board so as to save space in the wiring board and improve wiring density. Further advanced features of the wiring board can be achieved by increasing the number of layers of wiring.

However, since a core material (made of resin material, a filler and an interlayer insulating material or the like) and a wiring (made of metal material and via conductors or the like) are integrated to form a wiring board, a problem results from the internal stress (due to differences in the thermal expansion coefficient of these materials) that is concentrated on the wiring and the via conductors or the like. In particular, this internal stress tends to be concentrated on the stacked via where a series of via conductors is formed in the thickness direction of the core board. Further, when the number of via conductors in series (i.e., the number of layers of the interlayer insulating material) is large, the intensity of the internal stress tends to be great. Therefore, when manufacturing a wiring board in which the number of layers of the interlayer insulating material is larger than that of the conventional wiring board (e.g., three layers), a crack is likely to occur at a connection interface of the via conductors constituting a stacked via, thereby resulting in poor electrical reliability.

The present invention has been accomplished in view of the above problems, and an object of the invention is to provide a wiring board having a favorable electrical reliability and in which a crack is unlikely to occur at a connection interface of via conductors even though the number of via conductors in series, which constitutes the stacked via, becomes larger than that of the conventional wiring board.

SUMMARY OF THE INVENTION

In accordance with the present invention there is provided a wiring board including a core board in which a through-hole conductor is formed along an inner wall of a through-hole which penetrates a plate-like core material in the thickness direction of the core board and a filler is charged into through-holes; and a wiring laminate portion formed in such a manner that a plurality of conductor layers and a plurality of layer-shaped interlayer insulating materials are alternately laminated on a major plane of the core board. A plurality of via conductors used for an electrical connection between the conductor layers is embedded in the interlayer insulating materials. The via conductor embedded in each interlayer insulating material is stacked in a series of four or more layers in the thickness direction of the core board and constituting a stacked via which is electrically connected to the through-hole conductor. The interlayer insulating material is made of a resin material having a linear thermal expansion coefficient of 35 ppm/K or more to 50 ppm/K or less.

BRIEF DESCRIPTIONS OF THE DRAWINGS

FIG. 6 shows a result of a reliability test.

FIG. 8 shows a result of a thermal cycle test.

FIG. 9 is a table showing a result of a reliability test corresponding to the number of layers of a comparative example.

FIG. 10 is a table summarizing the result of FIG. 9.

FIG. 11 shows another position variations of a stacked via.

FIG. 12 shows a result of another thermal cycle test.

Figure 1:
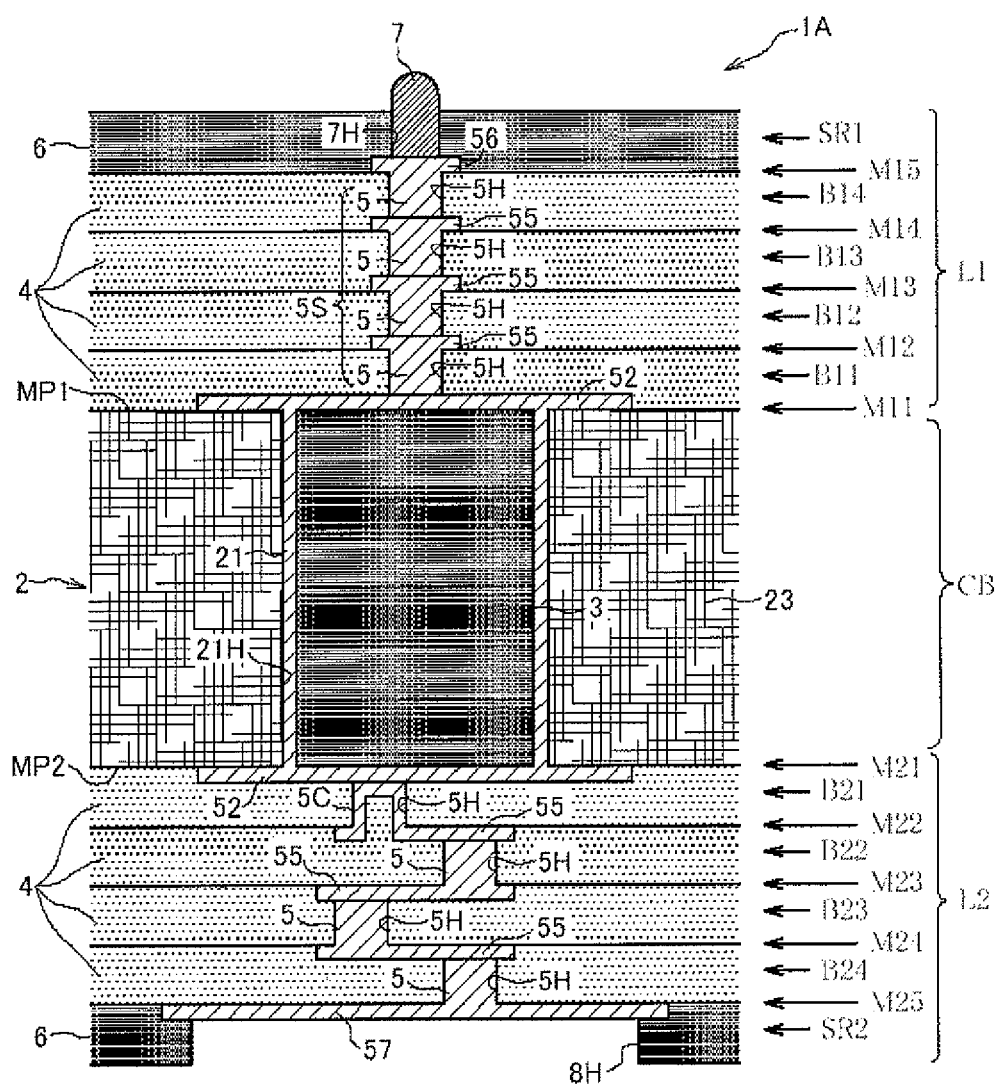
FIG. 1 is a schematic sectional view showing the structure of a wiring board according to a first embodiment of the invention.

DESCRIPTION OF REFERENCE NUMERALS 1A-1E: wiring board
CB: core board
2: core material
21: through-hole conductor
21H: through-hole
23: glass fiber
3: filler
4: interlayer insulating material
52: lid conductor
5: via conductor (filled via)
5C: via conductor (conformal via)
5i: shifting via conductor
5S: stacked via
B: resin insulating layer
M: conductor layer
L: wiring laminate portion

DETAILED DESCRIPTION OF THE INVENTION

A means for solving the above-mentioned problems associated with existing wiring boards is to provide a wiring board, comprising: a core board in which a through-hole conductor is formed along an inner wall of a through-hole which penetrates a plate-like core material in the thickness direction of the core board and a filler is charged into the through-hole; and a wiring laminate portion formed in such a manner that a plurality of conductor layers and a plurality of layer-shaped interlayer insulating materials are alternately laminated on a major plane of the core board, and a plurality of via conductors used for an electrical connection between the conductor layers is embedded in the interlayer insulating materials, wherein the via conductors embedded in each interlayer insulating material are stacked in a series of four or more layers in the thickness direction of the core board and constituting a stacked via which is electrically connected to the through-hole conductor, wherein the interlayer insulating material, the core material and the filler have the following features.

It is noted that the effect of the present invention can be obtained when at least one of the following items (1)-(3) (preferably any two of them, more preferably all of them) is/are satisfied.

(1) Interlayer Insulating Material

An interlayer insulating material can be made of a resin material having a linear thermal expansion coefficient of 35 ppm/K or more to 50 ppm/K or less. Since the interlayer insulating material encloses a stacked via, it is the major factor that stress is added to the stacked via. Thus, the stress added to a series of four-or-more-layer stacked via can be reduced to such an extent that a crack does not occur in a connection interface of a via conductor by setting the linear thermal expansion coefficient of the interlayer insulating material to be 50 ppm/K or less. As a result, a wiring board having a high electrical reliability is obtained. The linear thermal expansion coefficient of the interlayer insulating material is preferably 45 ppm/K or less, and more preferably 42 ppm/K or less. Although the minimum value of the linear thermal expansion coefficient is not particularly defined, for example, a linear thermal expansion coefficient of about 35 ppm/K is a general limit under the present circumstances.

In order to achieve the above-mentioned linear thermal expansion coefficient, the interlayer insulating material can be made of an epoxy resin material containing silica fillers of 30 wt % (% by weight) or more to 50 wt % or less. The linear thermal expansion coefficient of the interlayer insulating material can be adjusted with an amount of inorganic filler added to the resin material. Specifically, in addition to satisfying the above-mentioned linear thermal expansion coefficient, when taking into consideration other characteristics (such as dielectric property) required for an interlayer insulating material, an epoxy-system resin is preferably used as a resinous principle, and silica fillers are preferably used as an inorganic filler. The linear thermal expansion coefficient of the interlayer insulating material can be substantially reduced as mentioned earlier by adding the silica fillers of 30 wt % or more, preferably 35 wt % or more, more preferably 40 wt % or more. On the other hand, when too much of the silica fillers are added, a dielectric constant falls whereby the dielectric property required for the interlayer insulating material will not be satisfied. Thus, the amount of silica filler added is 50 wt % or less, preferably 45 wt % or less.

(2) Core Material

The core material can be made of a resin material having a linear thermal expansion coefficient of 20 ppm/K or more to 30 ppm/K or less. Since the core material has the largest volume ratio in the wiring board, the core material is a major factor contributing to the stress that is added to the stacked via. Thus, the stress added to the series of four-or-more-layer stacked via can be reduced to such an extent that a crack does not occur in the connection interface of the via conductor by setting the linear thermal expansion coefficient of the core material to be 30 ppm/K or less. This results in obtaining a wiring board having high electrical reliability. The linear thermal expansion coefficient of the core material is preferably 28 ppm/K or less, and more preferably 25 ppm/K or less. Although the minimum value of the linear thermal expansion coefficient is not particularly defined, for example, a linear thermal expansion coefficient of about 20 ppm/K is a general limit under the present circumstances.

The core material can be made of an epoxy-system resin material containing silica fillers as well as glass fibers. Although, a fiber-reinforced resin board (e.g., a board made of an epoxy resin which is strengthened with glass fibers) is conventionally used for the core material, the epoxy-system resin material containing silica fillers in addition to glass fibers can be suitably used as a core material to thereby substantially reduce a linear thermal expansion coefficient of the core material.

In order to achieve the above-mentioned linear thermal expansion coefficient, the core material can be made of the epoxy-system resin material containing silica fillers of 40 wt % or less. The linear thermal expansion coefficient of the core material can be adjusted with the amount of glass fibers and silica fillers contained in the epoxy-system resin. Specifically, the linear thermal expansion coefficient of the core material can be substantially reduced by adding the silica filler of 5 wt % or more, or 10 wt % or more. However, when too much of the silica fillers are added, the required amount of the epoxy-system resin as the core material cannot be secured, whereby the silica fillers of 40 wt % or less is added.

(3) Filler

Filler can be made of a resin material having a linear thermal expansion coefficient of 20 ppm/K or more to 35 ppm/K or less. The filler is used for filling the inside of a through-hole conductor. The filler expands like applying pressure on the wiring laminate portion locally from underneath. For example, when the stacked via is formed on a lid conductor which covers the end face of the through-hole or the like, the expanding filler will be a major factor that adds stress to the stacked via. Thus, the stress added to the series of four-or-more-layer stacked via can be reduced to such an extent that a crack does not occur in the connection interface of the via conductor by setting the linear thermal expansion coefficient of the filler to be 35 ppm/K or less. This results in obtaining a wiring board having a high electrical reliability. The linear thermal expansion coefficient of the filler is preferably 30 ppm/K or less, and more preferably 27 ppm/K or less. Although the minimum value of the linear thermal expansion coefficient is not particularly defined, for example, about 20 ppm/K is a general limit under the present circumstances.

In order to achieve the above-mentioned linear thermal expansion coefficient, the filler can be made of an epoxy-system resin material containing the silica fillers of 60 wt % or more to 80 wt % or less. Since a metal material encloses a circumference of the fillers, the linear thermal expansion coefficient is required to be reduced, as mentioned above. For that purpose, the amount of the silica fillers added is to be 60 wt % or more, preferably 65 wt % or more, and more preferably 70 wt % or more. However, when too much silica fillers are added, the required amount of the epoxy-system resin as the filler cannot be secured, whereby the silica fillers of 80 wt % or less are added.

(4) Correlation

Since the core material and the filler both constitute the core board, a thermal expansion of the core board is preferably as uniform as possible in order to reduce the stress concentrated on the stacked via or the like in the wiring laminate portion. That is, for example, when the filler in the core board causes a thermal expansion, the stress will be concentrated on the stacked via in the wiring laminate portion which is located on the filler. Thus, the core material and the filler preferably have generally the same value of the linear thermal expansion coefficient. More particularly, the proportion of the linear thermal expansion coefficient between the filler and the core material (the linear thermal expansion coefficient (ppm/K) of the filler/the linear thermal expansion coefficient (ppm/K) of the core material) preferably falls within the range of about 0.8 and 1.2.

The interlayer insulating material and the core material are located in a line in the thickness direction of the core board and serve as a wiring laminate portion and a core board, respectively. Since the core material of the core board has the largest volume ratio in the wiring board, the core material has a large impact on the application of pressure on the wiring laminate portion due to the thermal expansion thereof. Thus, the proportion of the linear thermal expansion coefficient between the interlayer insulating material and the core material (the linear thermal expansion coefficient (ppm/K) of the interlayer insulating material/the linear thermal expansion coefficient (ppm/K) of the core material) preferably falls within the range of about 1.4 and 1.9 that the impact on the application of pressure on the wiring laminate portion can balance with a resistance force of the wiring laminate portion.

The interlayer insulating material and the filler are located in a line in the thickness direction of the core board and serve as a wiring laminate portion and a core board, respectively. Since the filler of the core board is surrounded by the through-hole conductor, the filler has a large impact on the application of locally applied pressure on the wiring laminate portion due to the thermal expansion thereof. Thus, the proportion of the linear thermal expansion coefficient between the interlayer insulating material and the filler (the linear thermal expansion coefficient (ppm/K) of the interlayer insulating material/the linear thermal expansion coefficient (ppm/K) of the filler) preferably falls within the range of about 1.4 and 1.9 so that the impact on the application of locally applied pressure on the wiring laminate portion can balance with a resistance force of the wiring laminate portion.

(5) Positional Relationship

The stacked via is preferably formed on an area corresponding to the center of the through-hole and is electrically connected to the through-hole conductor via the lid conductor which covers the end face of the through-hole. When the end face of the through-hole is covered with the lid conductor, a portion of the lid conductor connected to the through-hole conductor is deformed as if being pulled in and the remaining portion thereof is deformed as if being pushed up due to the thermal expansion of the filler and the core material. This results from a large difference in the linear thermal expansion coefficient among the through-hole conductor connected to the lid conductor, the filler charged inside the through-hole conductor and the core material surrounding the through-hole conductor. At this time, since the area in the vicinity of where the through-hole conductor is connected and which is deformed as if being pulled in has a large angle, the stress in the lid conductor tends to be concentrated on the connection interface with the stacked via when the series of four-layer stacked via is disposed in the vicinity. Thus, the stacked via may be formed on the area corresponding to the center of the through-hole so as to avoid the location where the stress tends to be concentrated. (refer to FIGS. 1 and 2).

In the specification, an "upper direction" means a direction away from the core board (laminating direction of the wiring laminate portion) in the thickness direction thereof (the penetrating direction). Also, "on a through-hole" means an area where the through-hole extends in the thickness direction of the core board (i.e., an area defined by the end face of the through-hole when a major plane of the core board is projected from the thickness direction thereof). Further, an area corresponding to the center of the through-hole means, for example, a circular area having ½ (preferably ⅓) the diameter of the through-hole and formed coaxially with the through-hole.

Further, the stacked via may be preferably located in an area not on the through-hole. When the end face of the through-hole is covered with the lid conductor, as mentioned above, the area connected to the through-hole conductor in the lid conductor is deformed as if being pulled in. Therefore, when the series of four-layer stacked via is formed around this area, the stress tends to be concentrated on the connection interface with the lid conductor. Thus, contrary to the above-mentioned case, the stacked via may be formed in the area not on the through-hole so as to avoid the area where the stress tends to be concentrated (refer to FIG. 3). Further, when the stacked via is formed in an area not on the through-hole, it is still effective in the case where no lid conductor is formed and, instead, a flange conductor is formed around the opening end of the through-hole (refer to FIG. 4). Furthermore, the stacked via is preferably located in an area about ⅙ (more preferably, about ⅕) of the through-hole diameter away from the opening end of the through-hole.

In the specification, the "series of stacked via" means a construction that, for example, a part of the lower filled via and a part of the upper filled via is directly connected to each other when a filled via is formed in an interlayer insulating material and the other filled via is formed in the other interlayer insulating material in the upper direction. Therefore, the "series of four-or-more-layer stacked via" means a series of filled via formed in four or more layers according to the aforementioned construction.

Figure 5:
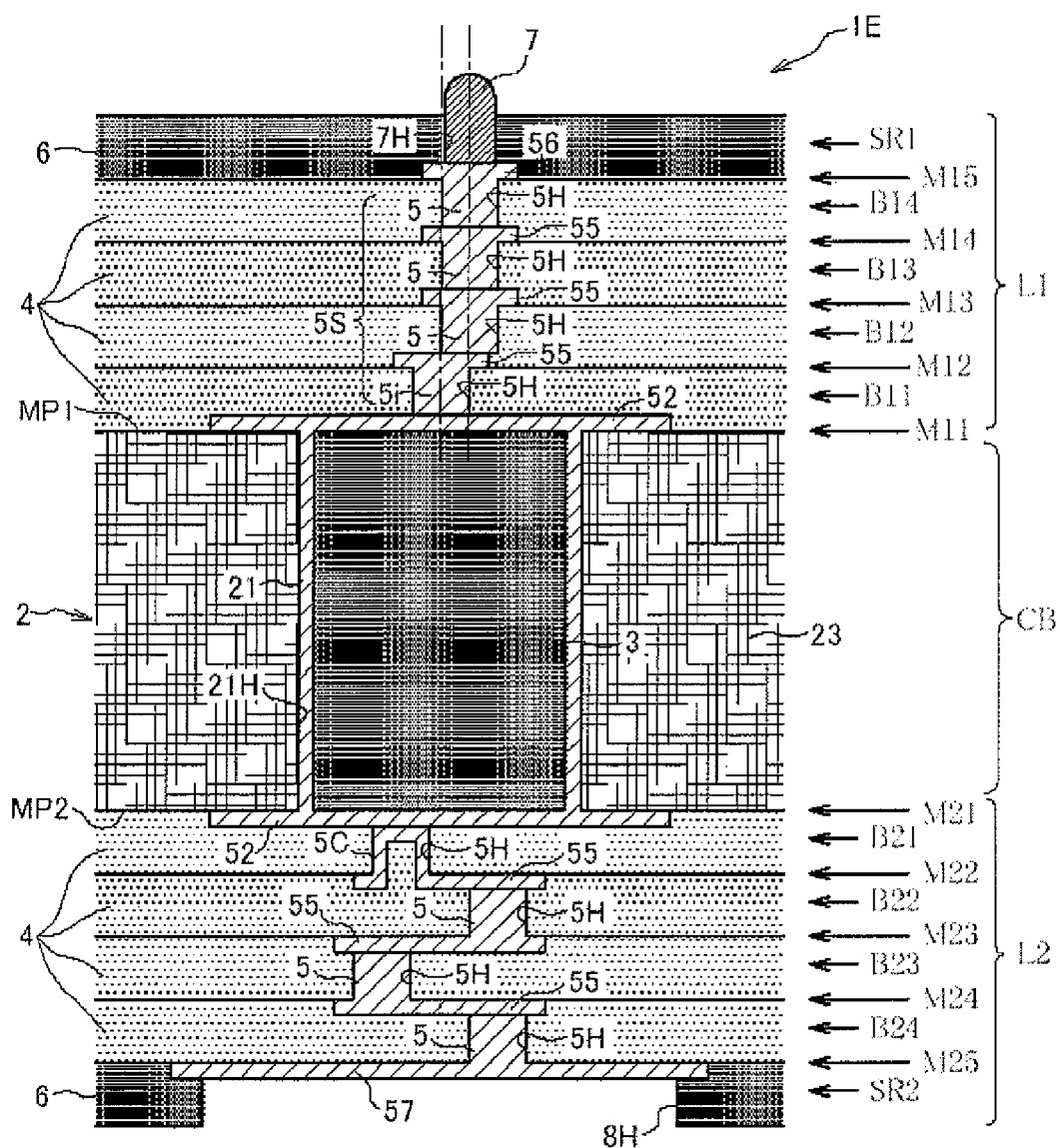
FIG. 5 is a schematic sectional view showing the structure of a wiring board according to a fifth embodiment of the invention.

Further, in the series of plural via conductors formed in the thickness direction of the core board, the stacked via preferably contains a shifting via conductor which shifts its axis along the major plane of the core board (refer to FIG. 5). When the series of four-or-more-layer stacked via is formed concentrically and connected to the lid conductor, a crack may occur in the connection interface with the lid conductor. This is because the stress caused by the difference in thermal expansion in the laminating direction between the stacked via and the interlayer insulating material is concentrated on the connection interface with the lid conductor. Therefore, the stress can be dispersed by means of shifting at least one of four or more layers of stacked via. Particularly, a shift amount of the axis of the shifting via conductor is preferably more than half of the via diameter. In other words, the stacked via containing the shifting via conductor is comprised of a plurality of first via conductors (group) having a first axis in the thickness direction of the core board and a second via conductor (shifting via conductor) having a second axis which is shifted from the first axis along the major plane of core board. In that case, the distance between the first axis and the second axis is preferably more than half the diameter of the second via conductor (shifting via conductor).

It is noted that the conductor layer or the via conductor can be made of, for example, copper as a metallic material having a linear thermal expansion coefficient of about 16 ppm/K or more to 18 ppm/K or less. Thus, considering the internal stress caused by the difference in the linear thermal expansion coefficient and reducing (alleviating) the stress added to the stacked via, the interlayer insulating material preferably contains a substantial amount of silica fillers (inorganic fillers) like the core material or the filler so as to reduce the linear thermal expansion coefficient therebetween to about 20 ppm/K, thereby making both linear thermal expansion coefficient almost equal. However, when the interlayer insulating material contains too much silica fillers (inorganic fillers), it will cause a decline in the dielectric constant as mentioned above, and also it will be difficult to produce a surface of the interlayer insulating material having a suitable roughness in a roughening process because a lot of silica fillers drop out. Thus, when the interlayer insulating material contains too much silica fillers and having the linear thermal expansion coefficient of less than 35 ppm/K, the surface roughening process cannot be conducted.

Further, the sufficient adhesion between the conductor layer and the via conductor or the like, which are to be laminated, cannot be secured, and a crack tends to occur in the connection interface between the via conductors (stacked via). This results in a wiring board with poor electrical reliability. Thus, the interlayer insulating material preferably has the linear thermal expansion coefficient as close as possible to that of the conductor layer or the via conductor (the linear thermal expansion coefficient of copper). Also, the linear thermal expansion coefficient of the interlayer insulating material falls within the above mentioned range by controlling the amount of the silica fillers to be added to the interlayer insulating material to such an extent that the surface roughening process can be carried out.

Furthermore, the internal stress resulting from the difference in the linear thermal expansion coefficient can be alleviated by thinly forming each interlayer insulating material into 20 μm or more to 40 μm or less in thickness, while making the linear thermal expansion coefficient of the interlayer insulating material close to that of the conductor layer or the via conductor. In the specification, the thickness of the insulating material (one layer) means a distance (thickness) from the conductor layer (wiring) to the conductor layer (wiring).

BEST MODE FOR CARRYING OUT THE INVENTION

A wiring board according to an embodiment of the present invention will be described below with reference to the drawings. FIG. 1 is a schematic sectional view showing the structure of a wiring board 1A according to a first embodiment of the invention. In the following description, as for a core board CB, a surface shown above in figures will be called a first major plane MP1 and a surface shown below will be called a second major plane MP2. The wiring board 1A is to be disposed between an IC chip and a main substrate, such as a motherboard. Solder bumps 7 comprised of solder, such as a Pb—Sn system or the like and formed on the first major plane MP1 are connected to the IC chip through a flip chip bonding. A solder ball or the like (not illustrated) is formed on a pad conductor 57 which is disposed on the second major plane MP2 so as to connect the main substrate.

The core board CB is mainly comprised of a core material board (hereinafter referred to as a core material) 2 made of an epoxy-system resin material which is reinforced by glass fibers 23. The core material 2 contains silica filler (not illustrated) besides the glass fiber 23, the details of which have been mentioned above. Further, the core material 2 has a through-hole 21H penetrating in the thickness direction of the core board CB, and a through-hole conductor 21 is formed by Cu plating on an inner wall of the through-hole 21H so as to electrically connect both wiring laminate portions L1, L2. A diameter of the through-hole 21H is, for example, 100 μm or more to 500 μm or less. A filler 3 made of an epoxy-system resin material which contains the silica filler is filled inside of the through-hole conductor 21. The details of the filler 3 are as have been mentioned above.

A lid conductor 52 made of Cu plating and covering an end face (an end face of the through-hole conductor 21 and an end face of the filler 3) of the through-hole 21H is formed on both major planes MP1, MP2 of the core board CB. The lid conductor 52 serves as a conductor layer M11, M21 which is a lowermost layer of the wiring laminate portion L1, L2 that will be described below. A reverse face of the lid conductor 52 on the first major plane MP1 is connected to the through-hole conductor 21, and a top face of the lid conductor 52 is connected to a stacked via 5S which will be described below (i.e., the top face serves as a receiver of the via conductor 5 embedded in a lowermost resin insulating layer B11) so as to electrically connect the through-hole conductor 21 and the stacked via 5S. A rear face of the lid conductor 52 formed on the second major plane MP2 is connected to the through-hole conductor 21, and a top face of the lid conductor 52 serves as a receiver of the via conductor (conformal via) 5C embedded in a lowermost resin insulating layer B21 so as to electrically connect the through-hole conductor 21 and the via conductor. The lid conductor 52 assumes a shape which includes the end face of the through-hole 21H—i.e., the shape which covers the periphery of an opening of the through-hole 21H.

The wiring laminate portions L1, L2 formed on the major planes MP1, MP2 of the core board CB, respectively, has a structure in which a plurality of resin insulating layers (B11-B14, B21-B24) and a plurality of conductor layers (M11-M15, M21-M25) are alternately laminated. The conductor layers M11-M15, M21-M25 include the lid conductors 52, pad conductors 55, 56, 57 and a wiring or the like (not illustrated) all of which are made of Cu plating. Interlayers between these conductor layers are connected by the via conductors 5. The pad conductors 55 is a conductor portion serving as a receiver of the via conductors 5 in the conductor layers M12-M14, M22-M24. The pad conductors 56, 57 are used for forming the solder bump 7 and the solder balls (not illustrated) in the conductor layers M15, M25. A Ni—Au plating is applied to a surface of the pad conductors 56, 57.

The resin insulating layers B11-B14, B21-B24 are made of an interlayer insulating material 4 which is an epoxy-system resin material containing silica filler, and the details are as have been mentioned above. The resin insulating layers B11-B14, B21-B24 insulate each of the conductor layers M11-M15, M21-M25 and have the via conductor 5 (filled via) for an interlayer connection, respectively, which is charged in a via hole 5H (the resin insulating layer B21 has a conformal via 5C (described below)). In the wiring board 1A according to the present embodiment, the four-layer resin insulating layers B11-B14, B21-B24 are laminated (larger number of layers than that of the conventional wiring board) in the wiring laminate portion L1 and L2, and the thickness of each layer is, for example, in a range from 20 μm or more to 40 μm or less. Further, a solder resist layer SR1, SR2 made of the same resin material as the resin material 6 is formed on the conductor layers M15, M25, respectively, and has an opening 7H, 8H therein for exposing the pad conductor 56, 57, respectively.

The diameter of the via conductor 5 in each resin insulating layer B11-B14, B21-B24 is, for example, 65 μm or more to 75 μm or less in the largest portion thereof (the diameter in the upper direction), and 50 μm or more to 60 μm or less in the smallest portion thereof (the diameter in the lower direction).

In the wiring laminate portion L1 of the first major plane MP1, four layers of via conductors 5 embedded in each resin insulating layer B11-B14 are stacked in series in the thickness direction of the core board so as to constitute the stacked via 5S. In the stacked via 5S, each via conductor 5 is disposed almost concentrically, and is formed so as to support a central axis. Further, the stacked via 5S is disposed on an area corresponding to a generally center location of the through-hole 21H. Such a stacked via 5S tends to raise stress that is concentrated near the connection interface of the lid conductor 52 which serves as a root of the stacked via 5S, as the number of via conductors 5 increases (i.e., the length of the stacked via 5S becomes longer). However, since the interlayer insulating material 4, the core material 2 and the filler 3 described above are employed in the present invention, the stress is reduced and a crack does not occur in the connection interface of the lid conductor 52, even though the stacked via 5S where four layers of via conductors 5 are disposed in series is employed.

In the wiring laminate portion L2 on the second major plane MP2, the via conductors 5, 5C embedded in the resin insulating layers B21-B24 are alternately allocated so as not to overlap each other in the thickness direction of the core board. The reason for that is to disperse the stress added to the via conductors 5, 5C. That is, in the wiring laminate portion L1 on the first major plane MP1, since the solder bumps 7 are formed close to each other (not illustrated), a high density wiring is necessary to establish a path from the lid conductor 52 to the solder bump 7 by forming the stacked via 5S. In the wiring laminate portion L2 on the second major plane MP2, since the conductor pad 57 is large, and since the path from the lid conductor 52 to the conductor pad 57 is not formed close to each other, the high density wiring is not necessary, whereby the conductor via 5, 5C can be allocated alternately. Further, the via conductor 5C embedded in the lowermost resin insulating layer B21 of the wiring laminate portion L2 and connected to the lid conductor 52 is comprised of the conformal via. The conformal via 5C is formed in such a manner that a Cu plating is applied to the inner wall of the via hole 5H, and the interlayer insulating material 4 of the resin insulating layer B22 is charged into the via hole 5H. Since the conformal via 5C is charged with the interlayer insulating material 4, the resistance to the stress is greater than that of the filled via 5 where inside of the via hole 5H is filled with a plating. Therefore, the conformal via 5C is suitable for connecting to the lid conductor 52 where the stress tends to be concentrated due to the pressure or the like from the filler 3.

The wiring board 1A is produced in such a manner that the resin insulating layers (B11-B14, SR1, B21-B24, SR2) and the conductor layers (M11-M15, M21-M25) are alternately laminated on both major planes MP1, MP2 of the core board CB to thereby form the wiring laminate portions L1 and L2, respectively. This can be done by a known build-up process (a process which combines a semi-additive method, a laminate formation of a film-shaped resin material and a photolithography technique or the like).

Further, the core board CB can be produced with the following procedures. First, the through-hole 21H penetrating in the thickness direction of the core board is formed in the core material 2 through a drill processing. Thereafter, the through-hole conductor 21 is formed on the inner wall of the through-hole 21H by applying a Cu plating (Cu electroplating is performed after electroless Cu plating) to the whole surface of the inner wall. Then, the filler 3 is charged inside of the through-hole 21H. Thereafter, the lid conductor 52 is formed by applying the Cu plating to the entire surfaces of the core board, and thereafter any excess Cu plating is removed by etching.

Next, another embodiment of the present invention will be described below. In the following, different parts from the wiring board 1A in the first embodiment will be mainly described. Any repeated portions are designated by like reference numerals descriptions and the description thereof are omitted.

Figure 2:
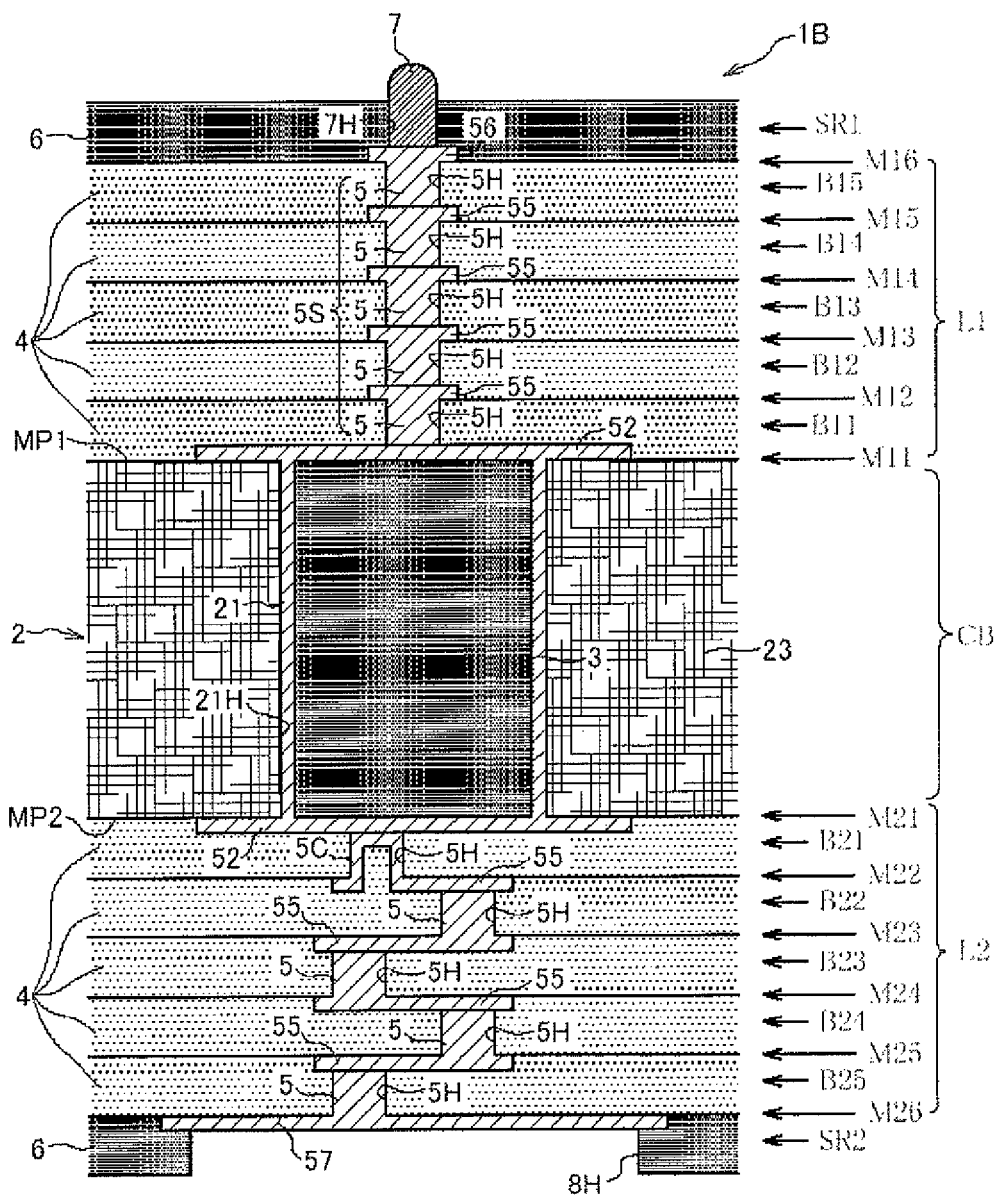
FIG. 2 is a schematic sectional view showing the structure of a wiring board according to a second embodiment of the invention.

FIG. 2 is a schematic sectional view showing the structure of a wiring board 1B according to a second embodiment. The number of via conductors 5 in series formed in the stacked via 5S may be four or more. In the wiring board 1B, the stacked via 5S has five layers of via conductors 5. That is, the wiring laminate portions L1, L2 of the wiring board 1B have five layers of resin insulating layers B11-B15, B21-B25. In the wiring laminate portion L1, the stacked via 5S is constituted such that the via conductors 5 embedded in each layer is stacked in a series of five layers. Since the interlayer insulating material 4, the core material 2 and the filler 3 described above are employed in the present invention, the stress is reduced and a crack does not occur in the connection interface of the lid conductor 52, even though the stacked via 5S where five layers of via conductors 5 are disposed in series is employed. Similarly, the stacked via 5S where six layers (further, seven layers or more) of via conductors 5 are disposed in series can be formed by increasing the number of resin insulating layers.

Figure 3:
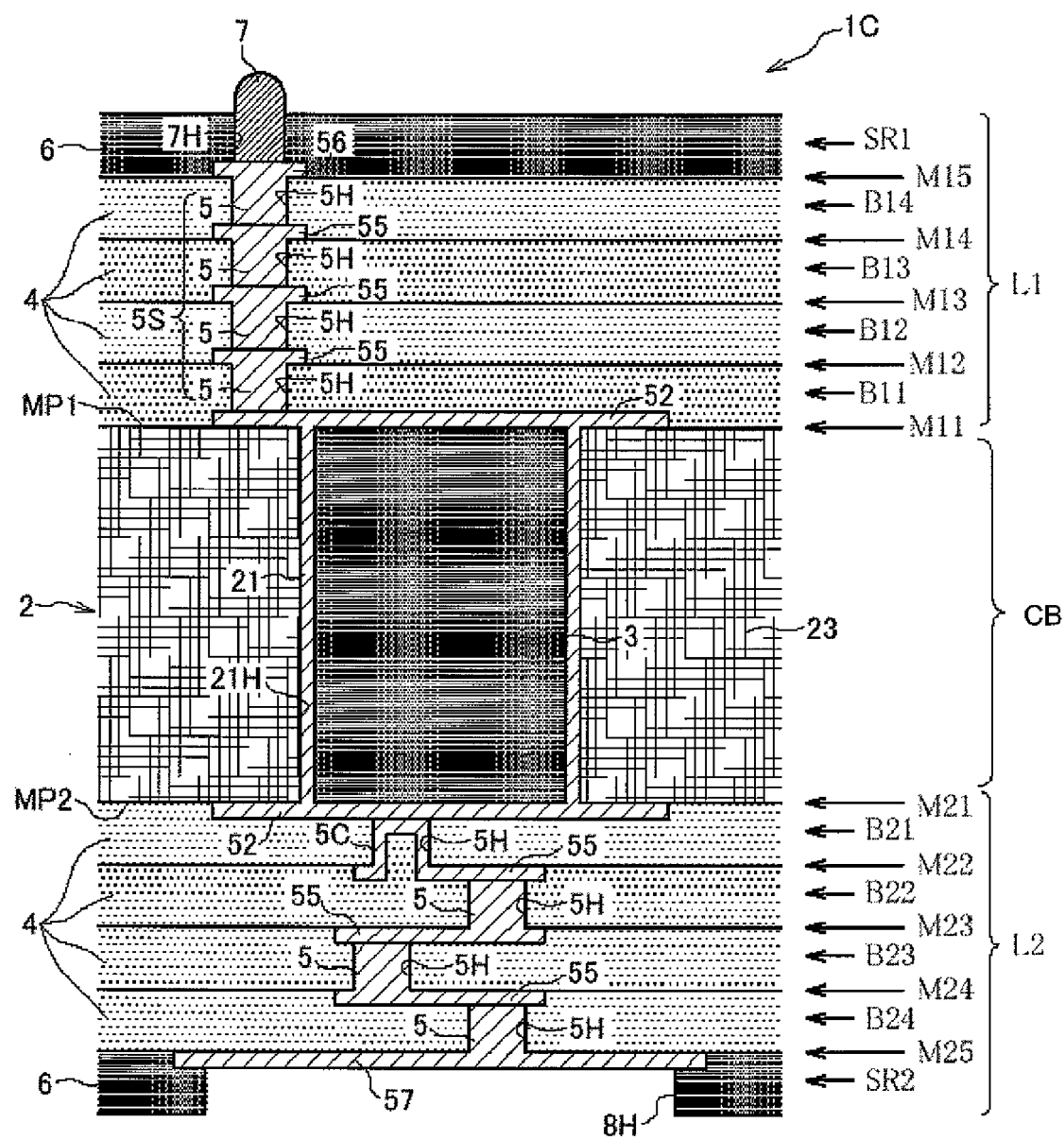
FIG. 3 is a schematic sectional view showing the structure of a wiring board according to a third embodiment of the invention.

FIG. 3 is a schematic sectional view showing the structure of a wiring board 1C according to a third embodiment. The stacked via 5S is formed in an area not on the through-hole 21H. That is, the stacked via 5S is connected to an area of the lid conductor 52 which covers the periphery of the opening of through-hole 21H so that the pressure brought from the filler 3 cannot reach due to the presence of the core material 2. Further, the stacked via 5S is preferably located in an area about ⅙ (more preferably, about ⅕) of the through-hole 21H diameter away from the opening end of the through-hole 21H. With this structure, the stress generated near the connection interface of the stacked via 5S can substantially be reduced by a deformation of the lid conductor 52.

Figure 4:
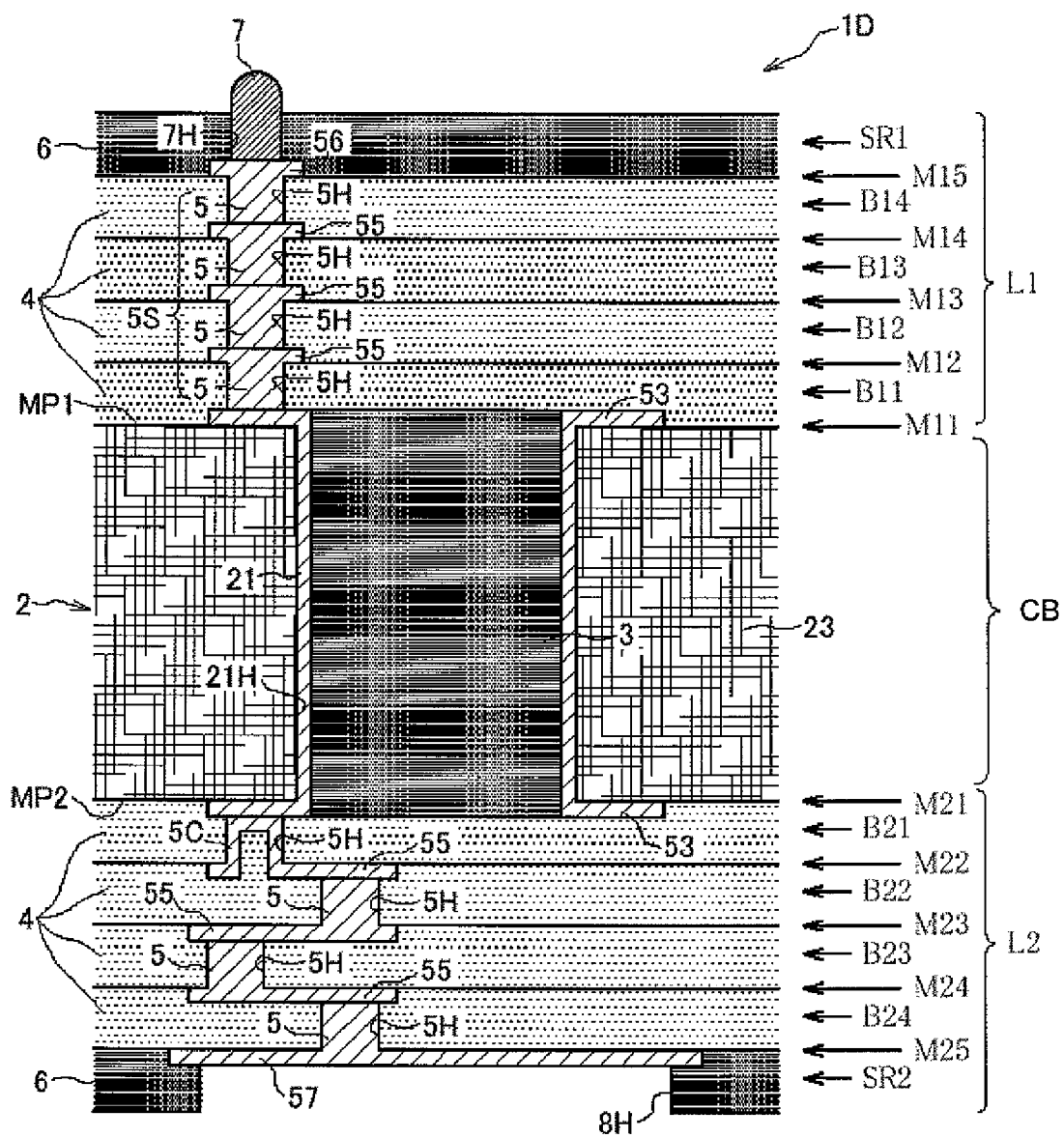
FIG. 4 is a schematic sectional view showing the structure of a wiring board according to a fourth embodiment of the invention.

FIG. 4 is a schematic sectional view showing the structure of a wiring board 1D according to a fourth embodiment. The wiring board 1D does not include the lid conductor, but alternatively has a flange conductor 53 covering the periphery of the opening end of the through-hole 21H. The flange conductor 53 is formed and integrated with the through-hole conductor 21. Because the wiring board 1D has no lid conductor, the manufacturing processes can be lessened compared to that of the wiring boards 1A-1C according to the above-mentioned embodiment. The stacked via 5S is connected to the flange conductor 53, and is disposed in an area not on the through-hole 21H. Similar to the wiring board 1C of the third embodiment, the stacked via 5S is preferably located in an area about ⅙ (more preferably, about ⅕) of the through-hole 21H diameter away from the opening end of the through-hole 21H.

FIG. 5 is a schematic sectional view showing the structure of a wiring board 1E according to a fifth embodiment. The stacked via 5S is constituted by a plurality of the via conductors 5 disposed almost concentrically with aligned central axes thereof and a via conductor 5i (shifting via conductor) having a central axis which is shifted along the major plane of the core board CB. That is, the via conductor 5i embedded in the resin insulating layer B11 has a different central axis (axis) from the central axis of other via conductors 5 embedded in the resin insulating layers B12-B14. Since the interlayer insulating material 4, the core material 2 and the filler 3 described above are employed in the present invention, and since at least one shift via conductor 5i is included, the stress is dispersed and a crack does not occur in the connection interface of the lid conductor 52. Moreover, an amount of shift of the shifting via conductor 5i is preferably a half or more of its diameter. With this structure, while realizing the high density wiring, the stress generated near the connection interface of the stacked via 5S can substantially be reduced by a deformation of the lid conductor 52. Similarly, this structure can be suitably employable under each condition of the wiring board 1A-1D according to the above-mentioned embodiment (number of layers, present/absent of the lid conductor or a position of the through-hole 21H). Although the shifting via conductor 5i is formed in the resin insulating layer B11 in the fifth embodiment, it can be formed in any resin insulating layers B12-B14.

The embodiments of the invention have been described above. However, the invention is not limited to these embodiments and can be practiced in appropriately modified forms within the range of equivalence.

Example of the Invention

Hereafter, tests conducted for confirming the effect of the invention will be described.

Embodiment of a Wiring Board

An embodiment of a wiring board was produced by employing a core material, filler and an interlayer insulating material, all of which satisfies the above-mentioned requirements. The embodiment includes the following components:

Core material: E679F produced by Hitachi, Ltd.
(Epoxy-system resin, CTE: 25 ppm/K, amount of silica fillers: 40 wt %)
Filler: an epoxy resin, a hardening agent and filler were mixed and kneaded using a three-roll mill to prepare a filling paste for a through-hole as filler. In detail, 63 parts by weight of bisphenol F epoxy resin and 33 parts by weight of aminophenol type epoxy resin as an epoxy resin, 4 parts by weight of dicyandiamide system hardening agent as a hardening agent and, as a filler, 220 parts by weight of silica powder classified in an average particle size of 6 μm and the maximum particle size of 24 μm were mixed. A small amount of catalyst core, thickener and antifoaming agent were added.
(Epoxy-system resin, CTE: 26 ppm/K, amount of silica fillers: 70 wt %)
Interlayer insulating material: ABF-GX13 by Ajinomoto Co., Inc.
(Epoxy-system resin, CTE: 41 ppm/K, amount of silica fillers: 42 wt %)

Four layers of resin insulating layer (interlayer insulating material) were laminated, and via conductor was embedded in each layer to thereby form a series of four-layer stacked via. The thickness of the resin insulating layer was 40 μm, the diameter of via conductor was 65 μm and the diameter of through-hole was 300 μm.

Comparative Example

Comparative examples of a wiring board were made by employing the conventional core material, filler and interlayer insulating material. In detail, the following materials were used:

Core material: R-1515T produced by Matsushita Electric Works, Ltd.
(Epoxy-system resin, CTE: 46 ppm/K)
Filler: THP-100DX1 produced by Taiyo Ink Mfg. Co., Ltd.
(Epoxy-system resin, CTE: 32 ppm/K, amount of silica fillers 50 wt %)
Interlayer insulating material: ABF-GX3 by Ajinomoto Co., Inc.
(Epoxy-system resin, CTE: 55 ppm/K)
Other components were the same as that of the wiring board embodiment described above.

The average thermal expansion coefficient of filler and the hardened body of an interlayer insulating material in the invention is measurable by the following methods. First, a cylindrical specimen of φ5 mm×20 mm (i.e., 5 mm diameter and 20 mm length) was produced from the filler and the interlayer insulating material by the method mentioned above and was subjected to a measurement by the TMA method. "TMA" herein means thermomechanical analysis specified in, for example, JIS-K7197 (coefficient-of-linear-expansion test method by the thermomechanical analysis of a plastic). Approximately 1 gram of compressive load was applied to the specimen in the thickness direction of the core board and they were cooled at −55 degree C. Thereafter, heat the specimen up to 215 degrees C. with a heating rate of 10-degree-C/10 minutes. At this time, the length of the specimen at −55 degree C., 25 degrees C. and 125 degrees C. was measured, respectively, and each value (ppm/K) of the average thermal expansion coefficient was calculated by substituting the resulted value in a formula 1, defined below. It is noted that a specimen produced by appropriately cutting a core material having no through-hole can be used, when measuring the average thermal expansion coefficient of the core material.

$$\alpha = \{(L_{125} - L_{-55})/(L_{25} \times (125 - (-55)))\} \quad \text{(Formula 1)}$$

where,
α: Average thermal expansion coefficient (ppm/K)
$L_{125}$: Length of sample at 125 degrees C. (mm)
$L_{-55}$: Length of sample at −55 degrees C. (mm)
$L_{25}$: Length of sample at room temperature (25 degrees C.) (mm)

(1) Reliability Test

The following tests were conducted on the wiring boards according to the wiring board embodiment described above and the comparative example based on the JEDEC standard. In the specification, T/S (Thermal Shock) means a liquid to liquid thermal shock test with an exposure time of 30 minutes. T/C (Thermal Cycle) means an air-to-air thermal shock test with an exposure time of 5 minutes. Condition A (0 degree C. to 100 degrees C.) and Condition B (−55 degree C. to 125 degree C.) were used in each thermal shock test. In the tests, the embodiment and the comparative example in which the stacked via was formed on the area corresponding to the center of the through-hole were used (refer to FIG. 1).

T/S-B (Thermal shock—Condition B) Test: 1000 cycles (−55 degree C. to 125 degree C.)
T/C-B (Thermal cycle—Condition B) Test: 500 cycles, 1000 cycles (−55 degree C. to 125 degree C.)
T/C-A (Thermal cycle—Condition A) Test: 3000 cycles (0 degree C. to 100 degrees C.)
HAST (Highly Accelerated Temperature and Humidity Stress Test): 135 degrees C., 85% RH, 96 hours After the test, the presence/absence of the crack in the stacked via was observed by the electron microscope. Five pieces of stacked via in each sample were subjected to the observation and categorized as either "tiny crack" representing a presence of at least one crack, or "no crack" representing an absence of the crack. The result is shown in FIG. 6.

According to the result, the crack was observed in the stacked via of the comparative example after the T/S-B and T/C-A tests, while no crack was observed in the stacked via of the wiring board embodiment described above. That is, it is apparent that the stress concentrated on the stacked via can be reduced by employing the core material, the filler and the interlayer insulating material which satisfies the above-mentioned requirements.

(2) Position Dependency

Figure 7:
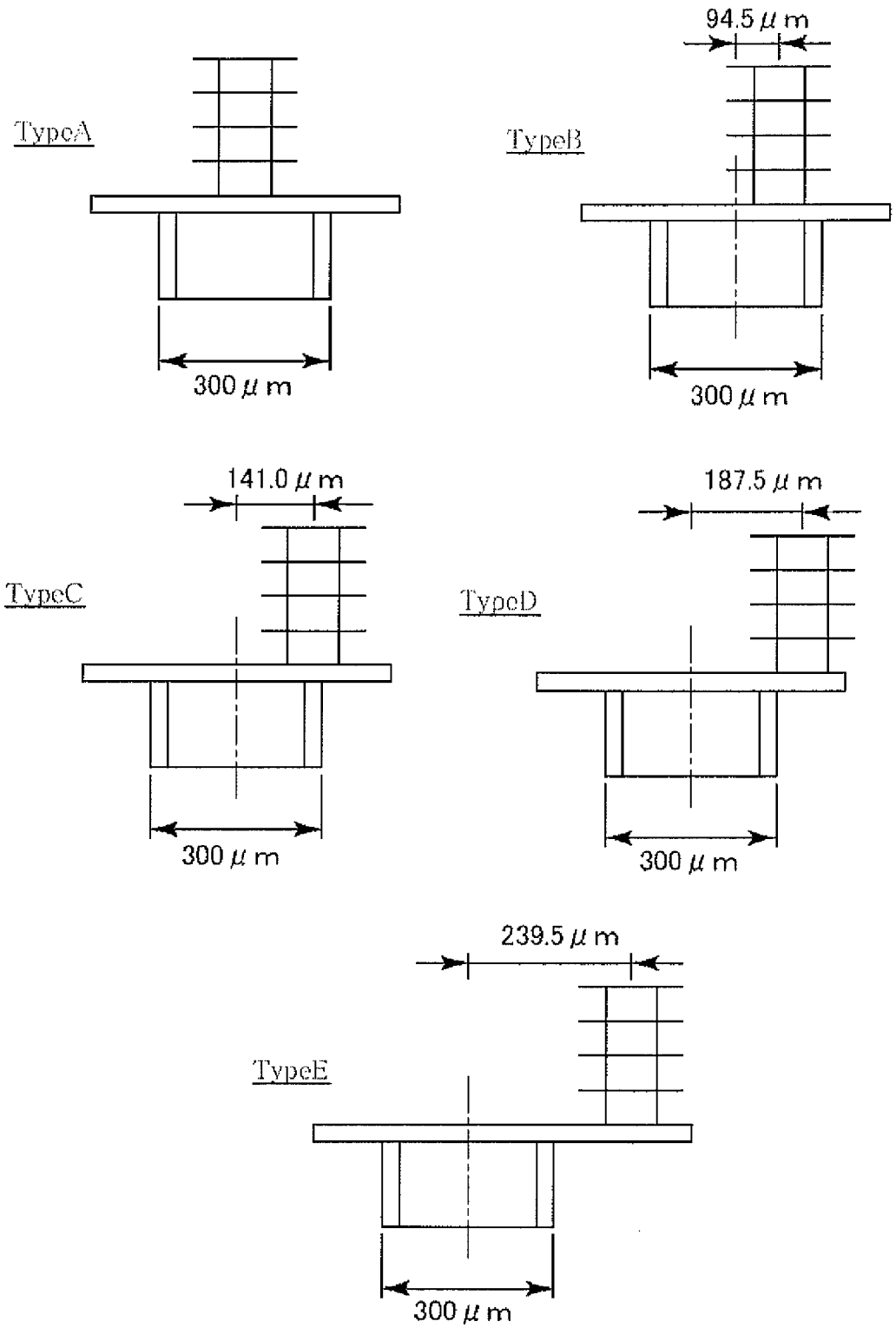
FIG. 7 shows positional variations of a stacked via.

As shown in FIG. 7, the wiring boards of the embodiment and the comparative example (100 pieces each) in which each stacked via was positioned in five different locations were prepared and subjected to the T/S-B test at a predetermined cycle (100 cycles, 500 cycles and 1000 cycles). After the test, the presence/absence of the crack in the stacked via was observed by the electron microscope. Each stacked via was under observation and categorized as either "tiny crack" representing a presence of at least one crack, or "no crack" representing an absence of the crack. The result is shown in FIG. 8.

According to the result, in the wiring board embodiment described above, the stacked via in any positions (Type A-E) did not contain any crack. That is, the crack was not observed either in the area corresponding to the center of the through-hole where little stress is concentrated (Type A), the outside of the through-hole (Type E: about 90 μm away from the opening end of the through-hole), nor in the vicinity of the through-hole conductor where the stress tended to be concentrated (Type B-D). In the comparative examples, although no crack was found after 100 cycles, the stacked via in all positions (Type A-E) contained the cracks after the 500 and 1000 cycles tests. That is, it is apparent that the stress concentrated on the stacked via can be reduced by employing the core material, the filler and the interlayer insulating material which satisfies the above-mentioned requirements.

Next, in the wiring board according to the comparative example, the following samples were prepared and subjected to the tests (T/S: 100 cycles, 500 cycles) in order to investigate how many layers (in series) of the stacked via can be formed on the core material. Samples in which a series of stacked via was formed on an area corresponding to the center of the through-hole; samples in which a series of stacked via was formed on an area corresponding to the edge of the through-hole; and samples in which a shift via conductor was formed in the first layer of the stacked via. The number of layers varied from three to six.

After the test, the stacked via was observed by the electron microscope to investigate as to whether any R-shift, crack or via-pop was found. An R-shift means a rate of resistance change used for checking as to whether any crack and/or delamination occurs in the stacked via after the TS-C (Temperature cycle test). When the rate of resistance change is 10% or more, it is considered as a generation of a crack. A via connection strength between the via and a pad conductor is inspected such that, for example, the bottom surface of the via is poked with a thin needle to confirm whether or not the surface thereof is peeled (viapop). The result of the test is shown in FIG. 9, and FIG. 10 is a table summarizing the result of FIG. 9.

According to the result, when the shifting via conductor was formed in the first layer, stacked via could be formed up to three layers in series. That is, when the shifting via conductor was not formed, a certain positional limitation (stacked via could be formed only in the area corresponding to the center of the through-hole) was required even in the three-layer structure. Also, it was found that the stacked via in four or more layers had a great risk on reliability whatever the position or structure thereof was.

In order to reconfirm the effect of the invention, as shown in FIG. 11, a wiring board in which the position of the stacked via was changed was produced using the core material, filler and interlayer insulating material satisfying the above-mentioned requirements, and the wiring board was subjected to the reliability test. The result is shown in FIG. 12. More particularly, the following material was used:

Core material: FR-5 produced by Hitachi, Ltd. (E679F)
(Epoxy-system resin, CTE: 26 ppm/K, amount of silica fillers: 35 wt %)
Filler: THP-100DX1 produced by Taiyo Ink Mfg. Co., Ltd.
(Epoxy-system resin, CTE: 32 ppm/K, amount of silica fillers: 50 wt %)
Interlayer insulating material: ABF-GXcode13 produced by Ajinomoto Co., Inc.
(Epoxy-system resin, CTE: 39 ppm/K, amount of silica fillers: 40 wt %)

Further, four resin insulating layers (interlayer insulating material) were laminated, and the via conductor was embedded in each layer to thereby form a series of four-layer stacked via. The thickness of each resin insulating layer was 30 μm, the diameter of each via conductor was 75 μm (top)/60 μm (bottom) or 65 μm (top)/50 μm (bottom), and the diameter of the through-hole was 300 μm.

According to the result of the test, some tiny cracks were observed in the T/S-B test (1000 cycles) in Design I having the stacked via with the diameter of 65 μm (top) and the T/C-B test (1000 cycles) in Design II. However, the stacked via with the diameter of 75 μm (top) did not contain any crack (no crack even in the stacked via formed on the area corresponding to the edge of the through-hole where the stress tended to be concentrated). Thus, it is apparent that the stress concentrated on the stacked via can be reduced by employing the core material, the filler and the interlayer insulating material which satisfies the above-mentioned requirements.

Other modifications and alterations will occur to others upon their reading and understanding of the specification. It is intended that all such modifications and alterations be included insofar as they come within the scope of the invention as claimed or the equivalents thereof.

Having described the invention, the following is claimed:

1. A wiring board, comprising:
  a core board in which a through-hole conductor is formed along an inner wall of a through-hole which penetrates a plate-like core material in the thickness direction of the core board and a filler that is charged inside the through-hole conductor formed along the inner wall of the through-hole;
  a flange conductor formed at an open end of the through-hole and surrounding the filler inside the through-hole conductor, wherein said flange conductor electrically connects said stacked via to the through-hole conductor,
  a first wiring laminate portion formed in such a manner that a plurality of conductor layers and a plurality of layer-shaped interlayer insulating material forming resin insulating layers are alternately laminated on a first major plane of the core board, and a plurality of via conductors used for an electrical connection between the conductor layers are embedded in the interlayer insulating material of the resin insulating layers,
  wherein the via conductors embedded in the interlayer insulating material of the resin insulating layers are stacked in a series of four or more layers in the thickness direction of the core board and constituting a stacked via which is electrically connected to the through-hole conductor, said stacked via located in an area not on the through-hole, wherein the interlayer insulating material is made of a resin material having a linear thermal expansion coefficient of 35 ppm/K or more to 50 ppm/K or less, wherein the core material is made of a resin material having a linear thermal expansion coefficient of 20 ppm/K or more to 30 ppm/K or less, and wherein the filler is made of a resin material having a linear thermal expansion coefficient of 20 ppm/K or more to 35 ppm/K or less.

2. A wiring board according to claim 1,
wherein the core material is made of an epoxy-system resin material containing silica fillers of 40 wt % or less.

3. A wiring board according to claim 1,
wherein the filler is made of an epoxy-system resin material containing silica fillers of 60 wt % or more to 80 wt % or less.

4. A wiring board according to claim 1,
wherein the interlayer insulating material is made of an epoxy-system resin material containing silica fillers of 30 wt % or more to 50 wt % or less.

5. A wiring board according to claim 1,
wherein, in the series of plural via conductors formed in the thickness direction of the core board, the stacked via includes a shifting via conductor which shifts an axis thereof along the first major plane of the core board.

6. A wiring board according to claim 5,
wherein a shift amount of the axis of the shifting via conductor is more than half the diameter thereof.

7. A wiring board according to claim 1, wherein said wiring board further comprises:
a second wiring laminate portion formed in such a manner that a plurality of conductor layers and a plurality of layer-shaped interlayer insulating material forming resin insulating layers are alternately laminated on a second major plane of the core board, and a plurality of via conductors used for an electrical connection between the conductor layers of the second wiring laminate portion are embedded in the interlayer insulating material of the resin insulating layers of the second wiring laminate portion,
wherein said via conductors embedded in the interlayer insulating material of the resin insulating layers of the second wiring laminate portion are alternately allocated so as not to overlap each other in the thickness direction of the core board.

8. A wiring board according to claim 1, wherein said wiring board further comprises:
a second wiring laminate portion formed in such a manner that a plurality of conductor layers and a plurality of layer-shaped interlayer insulating material forming resin insulating layers are alternately laminated on a second major plane of the core board, and a plurality of via conductors used for an electrical connection between the conductor layers of the second wiring laminate portion are embedded in the interlayer insulating material of the resin insulating layers of the second wiring laminate portion,
wherein said via conductor embedded in the interlayer insulating material of the lowermost resin insulating layer of the second wiring laminate portion is comprised of a conformal via.

9. A wiring board, comprising:
a core board in which a through-hole conductor is formed along an inner wall of a through-hole which penetrates a plate-like core material in the thickness direction of the core board and a filler that is charged inside the through-hole conductor formed along the inner wall of the through-hole;
a lid conductor covering an end face of the through-hole conductor and an end face of the filler inside the through-hole conductor, wherein said lid conductor electrically connects said stacked via to the through-hole conductor,
a first wiring laminate portion formed in such a manner that a plurality of conductor layers and a plurality of layer-shaped interlayer insulating material forming resin insulating layers are alternately laminated on a first major plane of the core board, and a plurality of via conductors used for an electrical connection between the conductor layers are embedded in the interlayer insulating material of the resin insulating layers,
wherein the via conductors respectively embedded in the interlayer insulating material of the resin insulating layers are stacked in a series of four or more layers in the thickness direction of the core board and constituting a stacked via which is electrically connected to the through-hole conductor, said stacked via located in an area not on the through-hole,
wherein the interlayer insulating material is made of a resin material having a linear thermal expansion coefficient of 35 ppm/K or more to 50 ppm/K or less,
wherein the core material is made of a resin material having a linear thermal expansion coefficient of 20 ppm/K or more to 30 ppm/K or less, and
wherein the filler is made of a resin material having a linear thermal expansion coefficient of 20 ppm/K or more to 35 ppm/K or less.

10. A wiring board according to claim 9,
wherein the core material is made of an epoxy-system resin material containing silica fillers of 40 wt % or less.

11. A wiring board according to claim 9,
wherein the filler is made of an epoxy-system resin material containing silica fillers of 60 wt % or more to 80 wt % or less.

12. A wiring board according to claim 9,
wherein the interlayer insulating material is made of an epoxy-system resin material containing silica fillers of 30 wt % or more to 50 wt % or less.

13. A wiring board according to claim 9,
wherein, in the series of plural via conductors formed in the thickness direction of the core board, the stacked via includes a shifting via conductor which shifts an axis thereof along the first major plane of the core board.

14. A wiring board according to claim 13,
wherein a shift amount of the axis of the shifting via conductor is more than half the diameter thereof.

15. A wiring board according to claim 9, wherein said wiring board further comprises:
a second wiring laminate portion formed in such a manner that a plurality of conductor layers and a plurality of layer-shaped interlayer insulating material forming resin insulating layers are alternately laminated on a second major plane of the core board, and a plurality of via conductors used for an electrical connection between the conductor layers of the second wiring laminate portion are embedded in the interlayer insulating material of the resin insulating layers of the second wiring laminate portion,
wherein said via conductors embedded in the interlayer insulating material of the resin insulating layers of the second wiring laminate portion are alternately allocated so as not to overlap each other in the thickness direction of the core board.

16. A wiring board according to claim 9, wherein said wiring board further comprises:
a second wiring laminate portion formed in such a manner that a plurality of conductor layers and a plurality of layer-shaped interlayer insulating material forming resin insulating layers are alternately laminated on a second major plane of the core board, and a plurality of via conductors used for an electrical connection between the conductor layers of the second wiring laminate portion are embedded in the interlayer insulating material of the resin insulating layers of the second wiring laminate portion,
wherein said via conductor embedded in the interlayer insulating material of the lowermost resin insulating layer of the second wiring laminate portion is comprised of a conformal via.

17. A wiring board, comprising:
a core board in which a through-hole conductor is formed along an inner wall of a through-hole which penetrates a plate-like core material in the thickness direction of the core board and a filler that is charged inside the through-hole conductor formed along the inner wall of the through-hole, wherein a conductor is located at one end of the through-hole, said conductor taking the form of one of the following:
(a) a lid conductor covering an end face of the through-hole conductor and an end face of the filler inside the through-hole conductor, said lid conductor electrically connecting said stacked via to the through-hole conductor,
(b) a flange conductor formed at an open end of the through-hole and surrounding the filler inside the through-hole conductor, said flange conductor electrically connecting said stacked via to the through-hole conductor;
a first wiring laminate portion formed in such a manner that a plurality of conductor layers and a plurality of layer-shaped interlayer insulating material forming resin insulating layers are alternately laminated on a first major plane of the core board, and a plurality of via conductors used for an electrical connection between the conductor layers are embedded in the interlayer insulating material of the resin insulating layers,
wherein the via conductors embedded in the interlayer insulating material of the resin insulating layers are stacked in a series of four or more layers in the thickness direction of the core board and constituting a stacked via which is electrically connected to the through-hole conductor, said stacked via located in an area not on the through-hole,
wherein the interlayer insulating material is made of a resin material having a linear thermal expansion coefficient of 35 ppm/K or more to 50 ppm/K or less,
wherein the core material is made of an epoxy-system resin material containing silica fillers and glass fibers, and
wherein the filler is made of an epoxy-system resin material containing silica fillers, said filler having a linear thermal coefficient of 20 ppm/K or more to 35 ppm/K or less.

18. A wiring board according to claim 17,
wherein the core material is made of an epoxy-system resin material containing silica fillers of 40 wt % or less.

19. A wiring board according to claim 17,
wherein the filler is made of an epoxy-system resin material containing silica fillers of 60 wt % or more to 80 wt % or less.

20. A wiring board according to claim 17,
wherein the interlayer insulating material is made of an epoxy-system resin material containing silica fillers of 30 wt % or more to 50 wt % or less.

21. A wiring board according to claim 17,
wherein, in the series of plural via conductors formed in the thickness direction of the core board, the stacked via includes a shifting via conductor which shifts an axis thereof along the first major plane of the core board.

22. A wiring board according to claim 21,
wherein a shift amount of the axis of the shifting via conductor is more than half the diameter thereof.

23. A wiring board according to claim 17, wherein said wiring board further comprises:
a second wiring laminate portion formed in such a manner that a plurality of conductor layers and a plurality of layer-shaped interlayer insulating material forming resin insulating layers are alternately laminated on a second major plane of the core board, and a plurality of via conductors used for an electrical connection between the conductor layers of the second wiring laminate portion are embedded in the interlayer insulating material of the resin insulating layers of the second wiring laminate portion,
wherein said via conductors embedded in the interlayer insulating material of the resin insulating layers of the second wiring laminate portion are alternately allocated so as not to overlap each other in the thickness direction of the core board.

24. A wiring board according to claim 17, wherein said wiring board further comprises:
a second wiring laminate portion formed in such a manner that a plurality of conductor layers and a plurality of layer-shaped interlayer insulating material forming resin insulating layers are alternately laminated on a second major plane of the core board, and a plurality of via conductors used for an electrical connection between the conductor layers of the second wiring laminate portion are embedded in the interlayer insulating material of the resin insulating layers of the second wiring laminate portion,
wherein said via conductor embedded in the interlayer insulating material of the lowermost resin insulating layer of the second wiring laminate portion is comprised of a conformal via.

\* \* \* \* \*